(12) United States Patent
Chen et al.

(10) Patent No.: US 8,741,764 B2
(45) Date of Patent: Jun. 3, 2014

(54) SEMICONDUCTOR DEVICE AND METHOD OF FORMING CONDUCTIVE PILLARS HAVING RECESSES OR PROTRUSIONS TO DETECT INTERCONNECT CONTINUITY BETWEEN SEMICONDUCTOR DIE AND SUBSTRATE

(75) Inventors: Jen Yu Chen, Hsinchu (TW); Ting Yu Fu, Hsinchu County (TW); Men Hsien Li, Taichung (TW); Chien Chen Lee, Hsinchu County (TW)

(73) Assignee: STATS ChipPAC, Ltd., Singapore (SG)

( * ) Notice: Subject to any disclaimer, the term of this patent is extended or adjusted under 35 U.S.C. 154(b) by 138 days.

(21) Appl. No.: 13/324,349

(22) Filed: Dec. 13, 2011

(65) Prior Publication Data
US 2013/0146872 A1      Jun. 13, 2013

(51) Int. Cl.
*H01L 21/44* (2006.01)
(52) U.S. Cl.
USPC .............. 438/612; 438/613; 257/E21.508
(58) Field of Classification Search
USPC .................... 438/106, 108, 612, 613, 614; 257/E21.508
See application file for complete search history.

(56) References Cited

U.S. PATENT DOCUMENTS

| 5,012,502 A | 4/1991 | Battin et al. |
| 5,184,768 A | 2/1993 | Hall et al. |
| 5,828,128 A | 10/1998 | Higashiguchi et al. |
| 2013/0015569 A1* | 1/2013 | Anderson et al. ............. 257/737 |
| 2013/0020698 A1* | 1/2013 | Hsieh et al. ................... 257/737 |

* cited by examiner

*Primary Examiner* — Hoai V Pham
(74) *Attorney, Agent, or Firm* — Robert D. Atkins; Patent Law Group: Atkins & Associates, P.C.

(57) ABSTRACT

A semiconductor device has a semiconductor die and conductive pillar with a recess or protrusion formed over a surface of the semiconductor die. The conductive pillar is made by forming a patterning layer over the semiconductor die, forming an opening with a recess or protrusion in the patterning layer, depositing conductive material in the opening and recess or protrusion, and removing the patterning layer. A substrate has bump material deposited over a conductive layer formed over a surface of the substrate. The bump material is melted. The semiconductor die is pressed toward the substrate to enable the melted bump material to flow into the recess or over the protrusion if the conductive pillar makes connection to the conductive layer. A presence or absence of the bump material in the recess or protrusion of the conductive pillar is detected by X-ray or visual inspection.

25 Claims, 20 Drawing Sheets

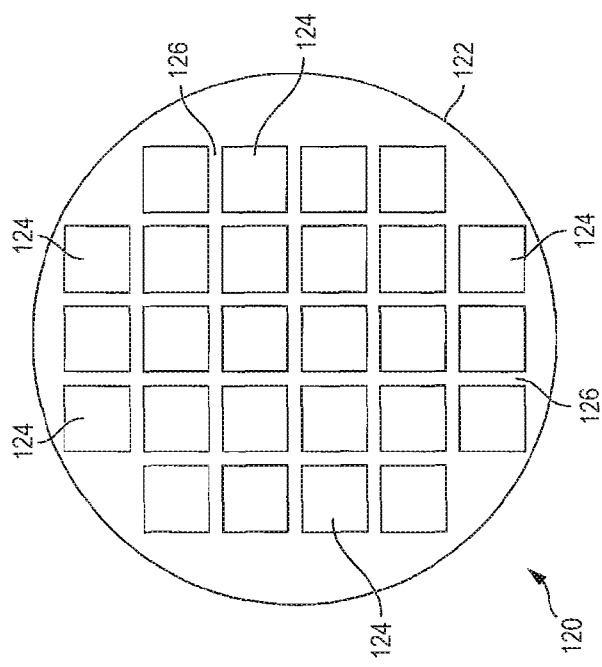
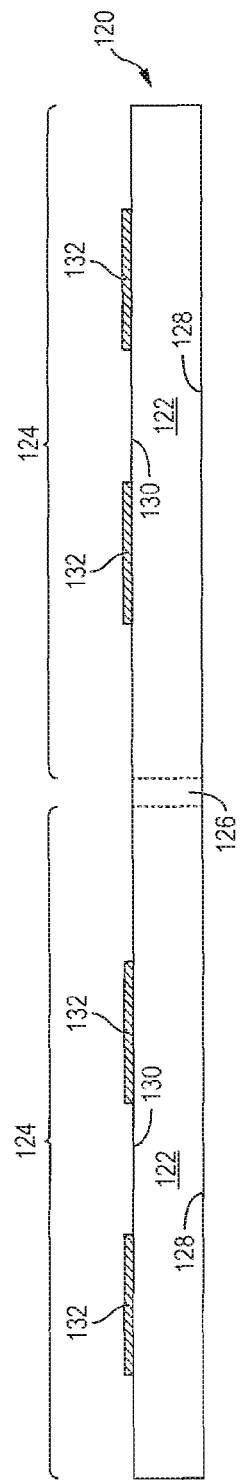

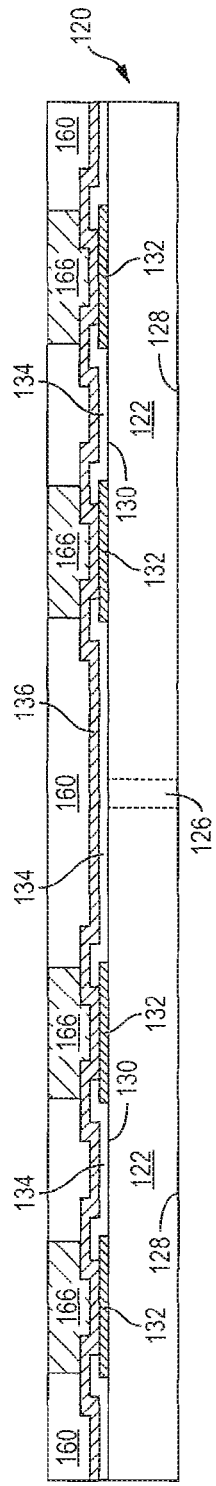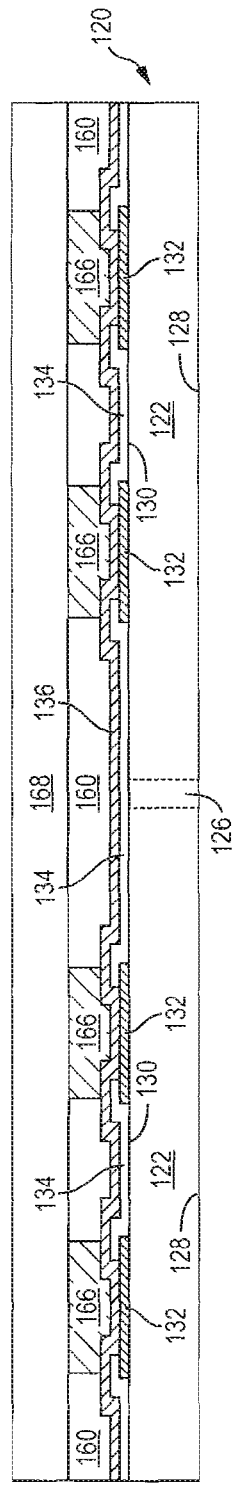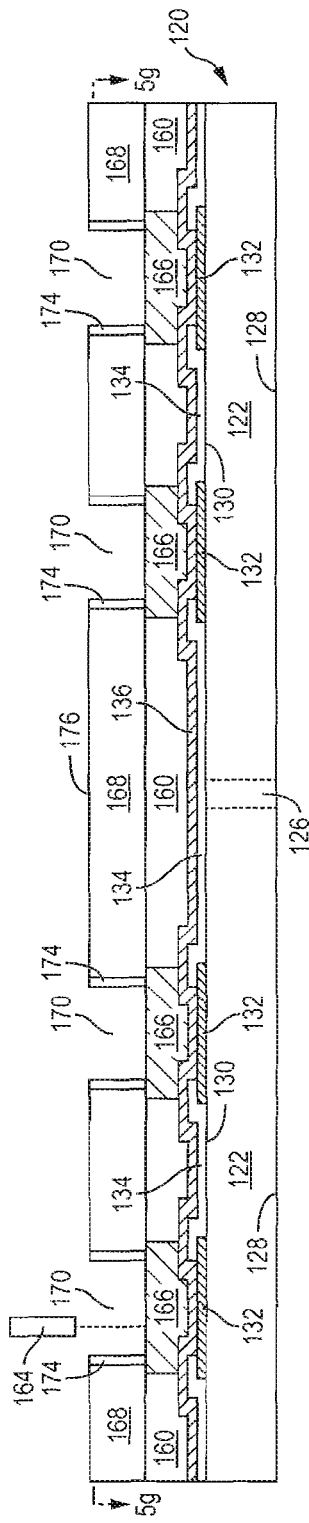
FIG. 5d
FIG. 5e
FIG. 5f

SEMICONDUCTOR DEVICE AND METHOD OF FORMING CONDUCTIVE PILLARS HAVING RECESSES OR PROTRUSIONS TO DETECT INTERCONNECT CONTINUITY BETWEEN SEMICONDUCTOR DIE AND SUBSTRATE

FIELD OF THE INVENTION

The present invention relates in general to semiconductor devices and, more particularly, to a semiconductor device and method of forming a conductive pillar having a recess or protrusion to detect continuity for an electrical interconnect between a semiconductor die and substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor die has a plurality of conductive pillars formed on the active surface of the die. A substrate has a plurality of contact pads and conductive traces formed on a surface of the substrate. The semiconductor die is mounted to the substrate and the conductive pillars are electrically and metallurgically connected to the contact pads or conductive traces. In some cases, less than all of the conductive pillars on the semiconductor die make good electrical contact to the contact pads or conductive traces on the substrate. An electrical interconnect failure between the conductive pillars on the semiconductor die and contact pads or conductive traces on the substrate should be detected during manufacturing.

X-ray imaging techniques are commonly used to examine the integrity of connections between the semiconductor die and substrate. X-ray imaging techniques have proven ineffective for the inspection of joints formed using conductive pillars and bump material in part because it is difficult to confirm the degree of interconnection of the joint formed between the conductive pillar and contact pad or conductive trace on the substrate.

SUMMARY OF THE INVENTION

A need exists to detect continuity of an electrical interconnect between the conductive pillars on the semiconductor die and contact pads or conductive traces on the substrate. Accordingly, in one embodiment, the present invention is a method of making a semiconductor device comprising the steps of providing a semiconductor die, forming a plurality of conductive pillars with recesses over a surface of the semiconductor die, providing a substrate having a conductive layer formed over a surface of the substrate, depositing bump material over the conductive layer, melting the bump material over the conductive layer, pressing the semiconductor die toward the substrate to enable the melted bump material to flow into the recesses if the conductive pillars make connection to the conductive layer, and detecting electrical continuity between the conductive pillars and conductive layer by a presence of the bump material in the recesses.

In another embodiment, the present invention is a method of making a semiconductor device comprising the steps of providing a semiconductor die, forming a conductive pillar with a recess or protrusion over a surface of the semiconductor die, providing a substrate having bump material deposited over a conductive layer formed over a surface of the substrate, melting the bump material, pressing the semiconductor die toward the substrate to enable the melted bump material to flow into the recess or over the protrusion if the conductive pillar makes connection to the conductive layer, and detecting a presence or absence of the bump material in the recess or protrusion of the conductive pillar.

In another embodiment, the present invention is a method of making a semiconductor device comprising the steps of providing a semiconductor die, forming a conductive pillar with a recess or protrusion over a surface of the semiconductor die for detecting electrical connection.

In another embodiment, the present invention is a semiconductor device comprising a semiconductor die and conductive pillar with a recess or protrusion formed over a surface of the semiconductor die for detecting electrical connection.

BRIEF DESCRIPTION OF THE DRAWINGS

FIGS. 3a-3m illustrate a process of forming a conductive pillar having a recess on a semiconductor die;

FIGS. 5a-5l illustrate a process of forming a multi-layer conductive pillar having a recess on a semiconductor die;

DETAILED DESCRIPTION OF THE DRAWINGS

Figure 1:
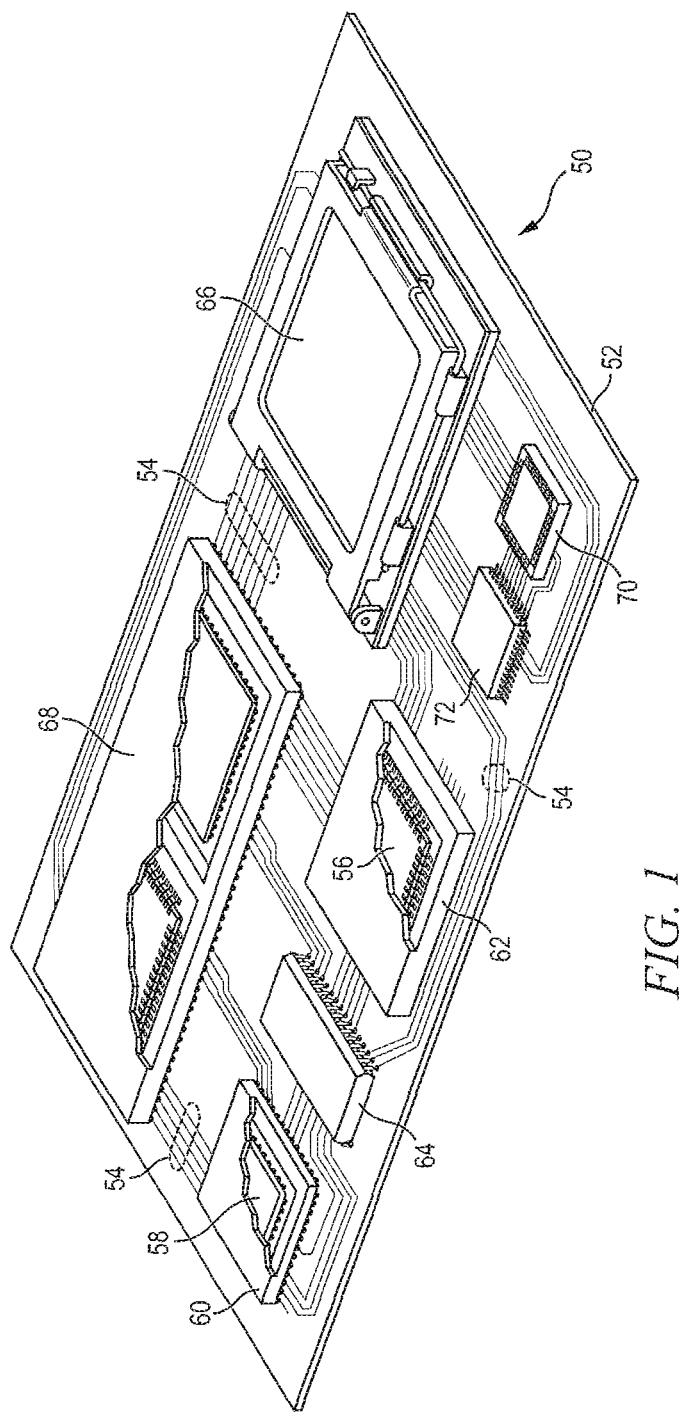
FIG. 1 illustrates a printed circuit board with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
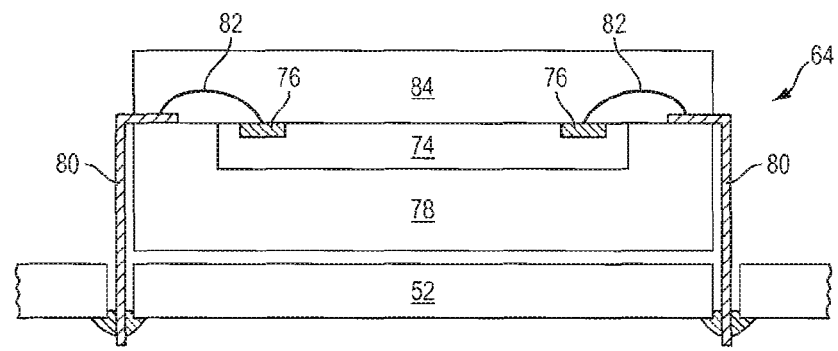
FIGS. 2a-2c illustrate further detail of the representative semiconductor packages mounted to the printed circuit board.
Figure 2B:
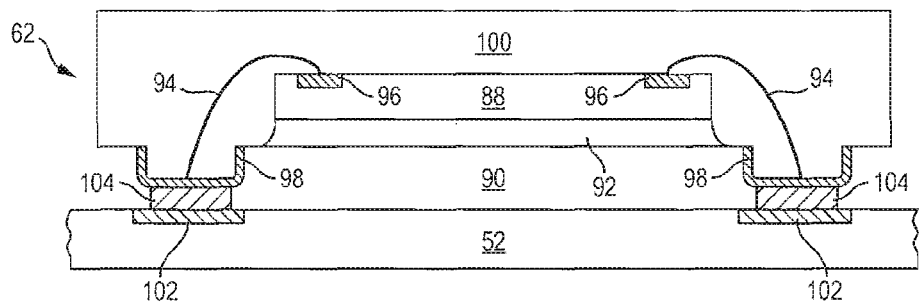
Figure 2C:
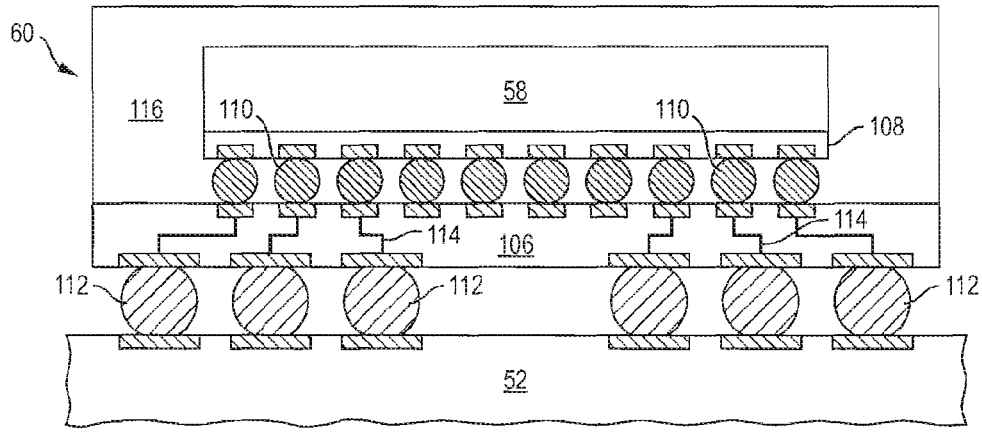

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3C:
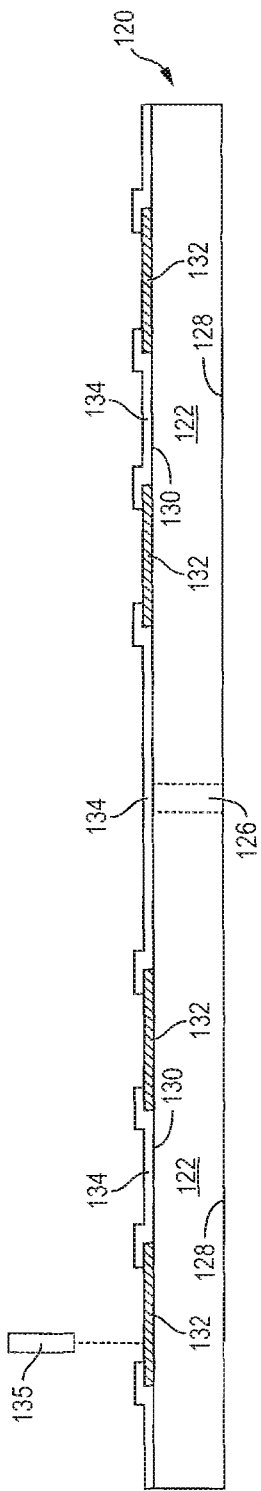

FIGS. 3a-3m illustrate, in relation to FIGS. 1 and 2a-2c, a process of forming a conductive pillar having a recess on a semiconductor die. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be disposed side-by-side a first distance from the edge of semiconductor die 124, as shown in FIG. 3b. Alternatively, conductive layer 132 can be offset in multiple rows such that a first row of contact pads is disposed a first distance from the edge of the die, and a second row of contact pads alternating with the first row is disposed a second distance from the edge of the die.

In FIG. 3c, an insulating or passivation layer 134 is conformally applied over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 134 is removed by an etching process through a patterned photoresist layer to expose conductive layer 132. Alternatively, a portion of insulating layer 134 is removed by laser direct ablation (LDA) using laser 135 to expose conductive layer 132. In one embodiment, the exposed width of conductive layer 132 is 15-80 μm. A portion of conductive layer 132 remains covered by insulating layer 134.

Figure 3D:
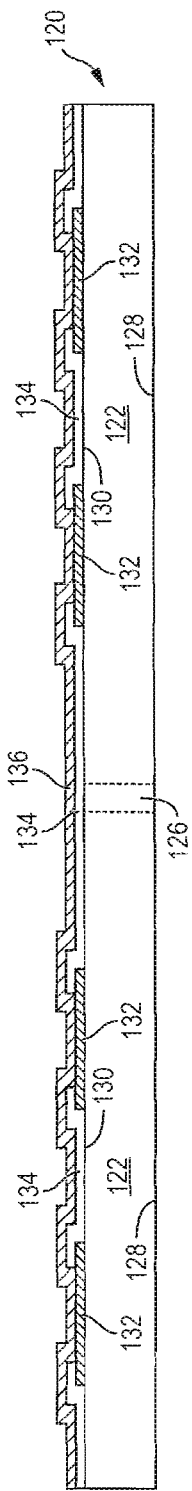

In FIG. 3d, a blanket conductive layer 136 is conformally applied over insulating layer 134 and conductive layer 132 using a patterning and metal deposition process such as printing, PVD, CVD, electrolytic plating, and electroless plating. In one embodiment, blanket conductive layer 136 acts as a seed layer. Conductive layer 136 can be any suitable alloy seed layer, such as titanium copper (TiCu), titanium tungsten copper (TiWCu), or tantalum nitrogen copper (TaNCu). Conductive layer 136 is electrically connected to conductive layer 132 and follows the contour of insulating layer 134 and conductive layer 132.

Figure 3E:
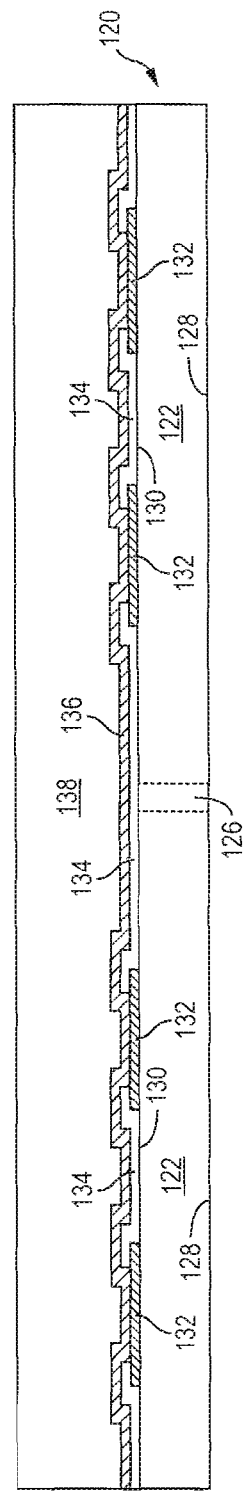

In FIG. 3e, a patterning or photoresist layer 138 is formed over conductive layer 136 using printing, spin coating, or spray coating. In some embodiments that utilize an insulating layer for patterning, the insulating layer can include one or more layers of SiO2, Si3N4, SiON, Ta2O5, Al2O3, or other material having similar structural properties.

Figure 3F:
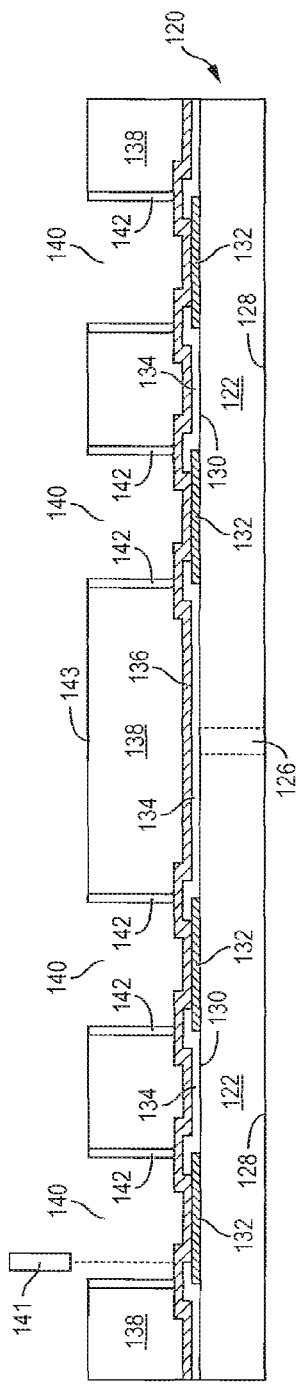

In FIG. 3f, a portion of photoresist layer 138 is removed by an etching process to form openings 140 and expose conductive layer 136 over conductive layer 132. The openings 140 include a plurality of protrusions or projections 142 of photoresist layer 138 extending inward into the opening. Alternatively, openings 140 are formed by LDA using laser 141 to expose conductive layer 136 over conductive layer 132.

Figure 3G:
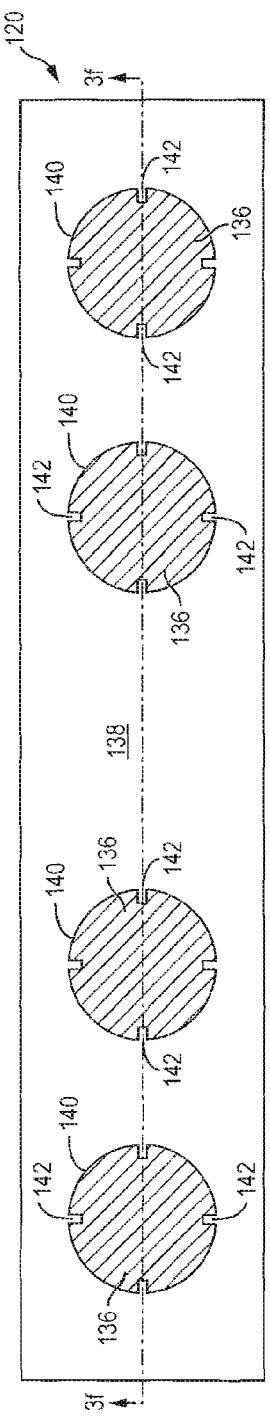

FIG. 3g shows a plan view of photoresist layer 138 and openings 140. In one embodiment, openings 140 have a generally cylindrical shape with a generally circular cross-section. In another embodiment, openings 140 have a generally cubic shape with a generally rectangular cross-section. In particular, protrusions 142 are formed on four equally spaced locations around openings 140 and extend vertically from conductive layer 136 to surface 143.

Figure 3H:
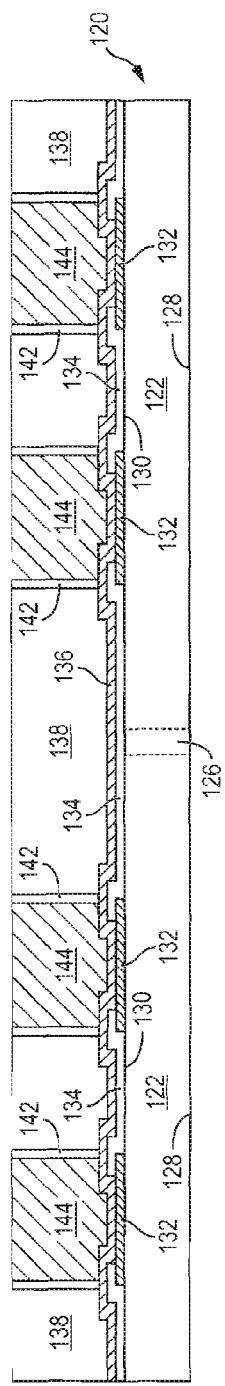

In FIG. 3h, an electrically conductive material 144 is deposited within openings 140 around protrusions 142 and over conductive layer 136 using an evaporation, electrolytic plating, electroless plating, or screen printing process. Conductive material 144 can be one or more layers of Al, Cu, Sn, Ni, Au, Ag, or other suitable electrically conductive material. The volume of conductive material 144 deposited into openings 140 is determined by a thickness of photoresist layer 138 and a cross-sectional area or aperture size of openings 140, taking into account protrusions 142.

Figure 3I:
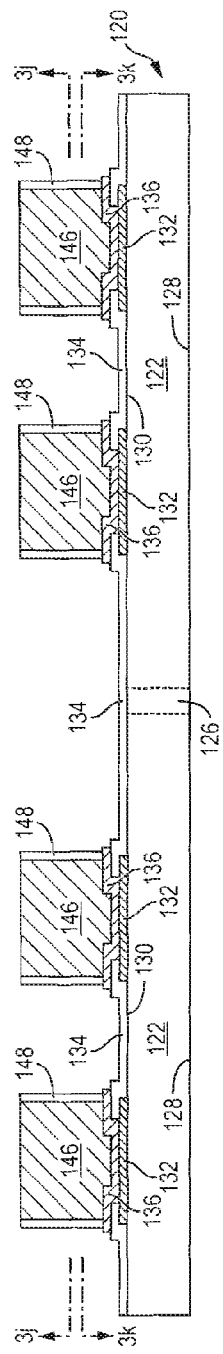
Figure 3J:
Figure 3K:
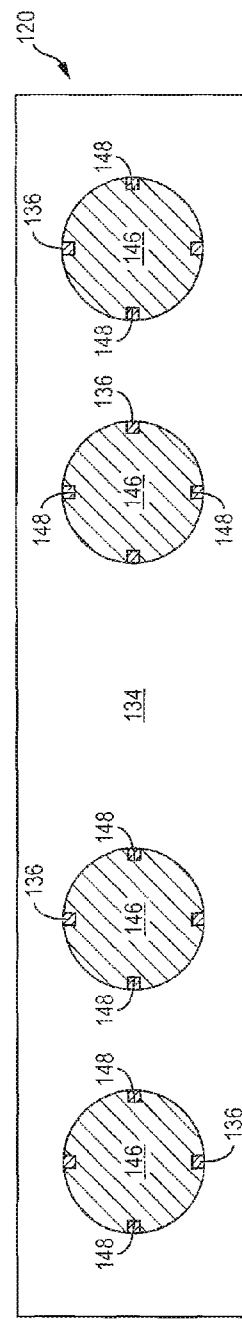
Figure 3L:
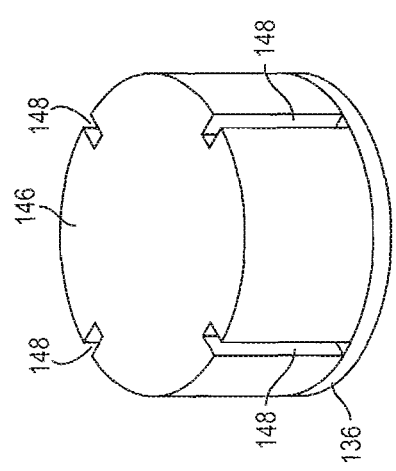

In FIG. 3i, photoresist layer 138, including protrusions 142, is removed using an etching process and leaving conductive pillars 146 having recesses or notches 148 formed over conductive layer 136. A portion of conductive layer 136 outside a footprint of conductive pillars 146 is also removed by an etching process to expose insulating layer 134. FIG. 3j shows a plan view of conductive pillars 146 with recesses 148 formed over semiconductor die 124, taken along line 3j-3j of FIG. 3i. FIG. 3k shows a plan view of conductive pillars 146 with recesses 148 formed over semiconductor die 124, taken along line 3k-3k of FIG. 3i. FIG. 3l shows a prospective view of one conductive pillar 146 with recesses 148. In particular, removing protrusions 142 of photoresist layer 138 from conductive material 144 leaves recesses 148 in conductive pillar 146.

Figure 3M:
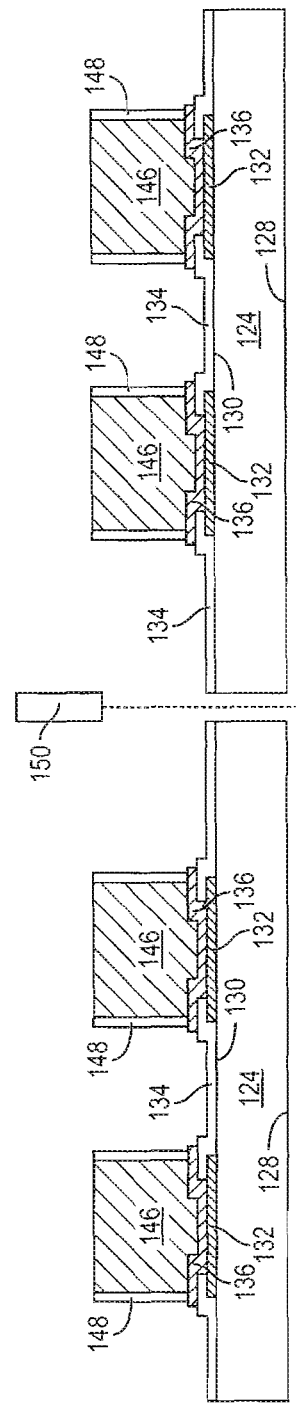

In FIG. 3m, semiconductor wafer 120 is singulated through insulating layer 134 and saw street 126 with saw blade or laser cutting tool 150 into individual semiconductor die 124.

Figure 4A:
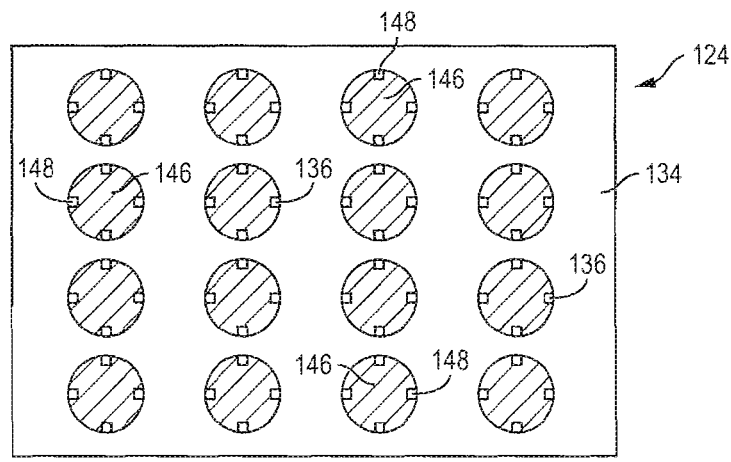
FIGS. 4a-4f illustrate mounting the semiconductor die to the substrate and detecting continuity of the electrical interconnect by presence of bump material in the recess.

FIG. 4a shows a plan view of semiconductor die 124 after singulation. The circuits formed on active surface 130 are electrically connected through conductive layer 132 and conductive layer 136 to conductive pillars 146.

Figure 4B:
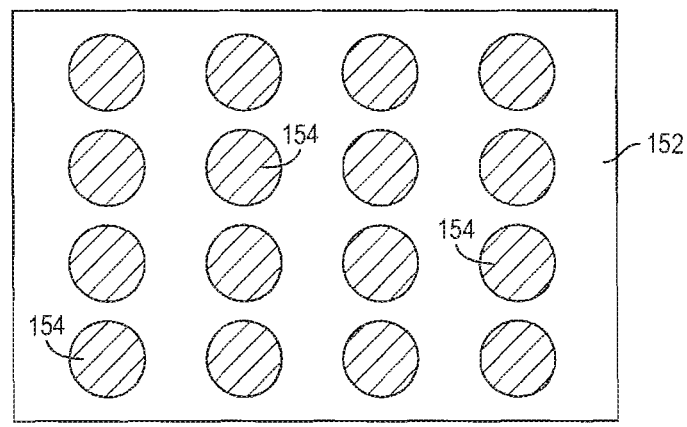

FIG. 4b shows a plan view of substrate or PCB 152 for structural support and electrical interconnect to semiconductor die 124. Conductive layer 154 is formed over a surface or within layers of substrate 152 using evaporation, electrolytic plating, electroless plating, screen printing, or other suitable metal deposition process. Conductive layer 154 includes contact pads and conductive traces for electrical communication, as well as power and ground connections, to semiconductor die 124.

Figure 4C:
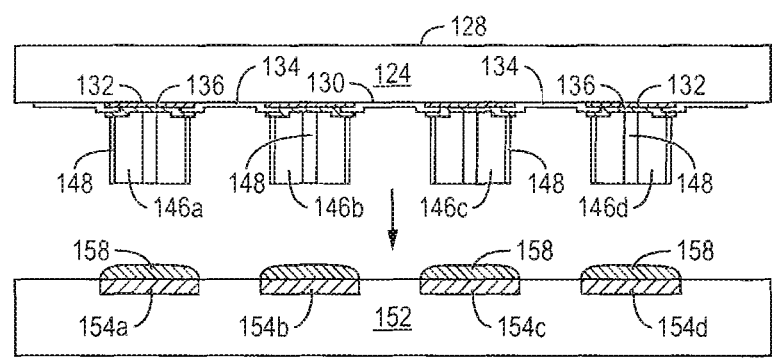

In FIG. 4c, an electrically conductive bump material 158 is deposited over conductive layer 154 using an evaporation, electrolytic plating, electroless plating, ball drop, or screen printing process. Bump material 158 can be Al, Sn, Ni, Au, Ag, Pb, Bi, Cu, solder, and combinations thereof, with an optional flux solution. For example, bump material 158 can be eutectic Sn/Pb, high-lead solder, or lead-free solder. Alternatively, a conductive paste is deposited over conductive layer 154.

Semiconductor die 124 from FIGS. 3a-3m is positioned over substrate 152 using a pick and place operation with active surface 130 oriented toward the substrate and conductive pillars 146a-146d aligned to bump material 158 over conductive layer 154a-154d. Prior to pressing conductive pillars 146 onto conductive layer 154, the temperature of bump material 158 is elevated to melt the bump material.

In the present example, conductive pillars 146a, 146b, and 146d have greater height than conductive pillar 146c due to process variation or warpage. Semiconductor die 124 is pressed toward substrate 152 and conductive pillars 146a, 146b, and 146d make electrical and metallurgical connection to conductive layer 154a, 154b, and 154d, respectively. Due to its lesser height or warpage, conductive pillar 146c fails to make contact with bump material 158 of conductive pillar 146c.

Figure 4D:
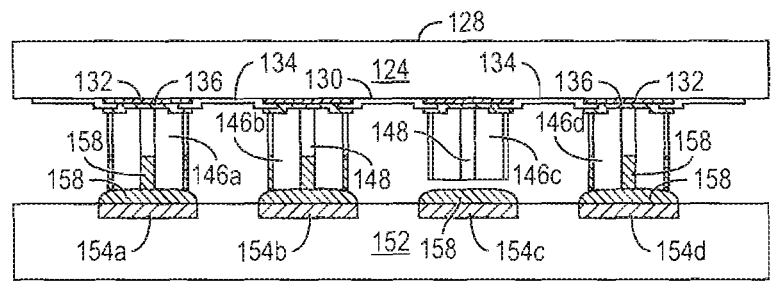

FIG. 4d shows semiconductor die 124 mounted to substrate 152 with conductive pillars 146a, 146b, and 146d electrically and metallurgically connected to conductive layer 154a, 154b, and 154d with bump material 158, respectively. Conductive pillars 146 have recesses 148 extending above the joint between conductive pillar 146 and conductive layer 154 for detecting electrical interconnect continuity by X-ray or visual inspection. Recesses 148 of conductive pillars 146 also provide greater contact surface between the conductive pillar and bump material 158. When conductive pillars 146a, 146b, and 146d of semiconductor die 124 are pressed into bump material 158 over conductive layer 154a, 154b, and 154d of substrate 152, the melted bump material 158 flows into recesses 148 of conductive pillars 146a, 146b, and 146d. Bump material 158 is present and can be detected in recesses 148 of conductive pillars 146a, 146b, and 146d extending above the joint between conductive layer 154a, 154b, and 154d and the corresponding conductive pillars. Due to its lesser height or warpage, conductive pillar 146c fails to make contact with bump material 158 and is not pressed onto conductive layer 154c. The melted bump material 158 does not flow into recess 148 of conductive pillar 146c.

Figure 4E:
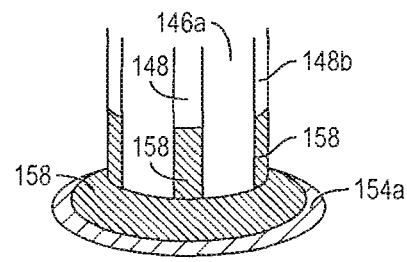
Figure 4F:
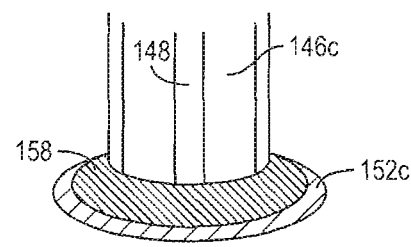

FIG. 4e shows an isolated prospective view of conductive pillar 146a electrically and metallurgically connected to conductive layer 154a with bump material 158. Bump material 158 has dispersed into recesses 148 as conductive pillar 146a is pressed onto conductive layer 154a. FIG. 4f shows an isolated prospective view of conductive pillar 146c failing to make electrical and metallurgical connection to conductive layer 154c. Due to its lesser height or warpage, conductive pillar 146c is not pressed onto the melted bump material 158 over conductive layer 154c. The melted bump material 158 does not flow into recess 158 of conductive pillar 146c.

Accordingly, conductive pillars 146 with recesses 148 provide continuity confirmation or inspection and fault detection for electrical interconnects between semiconductor die 124 and substrate 152. In the present example, conductive pillars 146a, 146b, and 146d have been pressed into bump material 158 over conductive layer 154a, 154b, and 154d to a sufficient depth that a portion of the melted bump material flows into recesses 148 of conductive pillars 146a, 146b, and 146d. The presence of bump material 158 in recesses 148 indicates electrical continuity and a reliable interconnect union between conductive pillars 146 and conductive layer 154. In the case of conductive pillar 146c, the melted bump material 158 does not flow into recesses 158 of conductive pillar 146c due to failure to make metallurgical connection to conductive layer 154c. The absence of bump material 158 in recesses 148 of conductive pillar 146c indicates no electrical continuity, no interconnect union, or less than reliable interconnect union between conductive pillar 146c and conductive layer 154c. Since recesses 148 extend above the joint between conductive pillar 146 and conductive layer 154, the presence or absence of bump material 158 in recesses 148 can be readily detected or observable by X-ray or visual inspection.

Figure 5A:
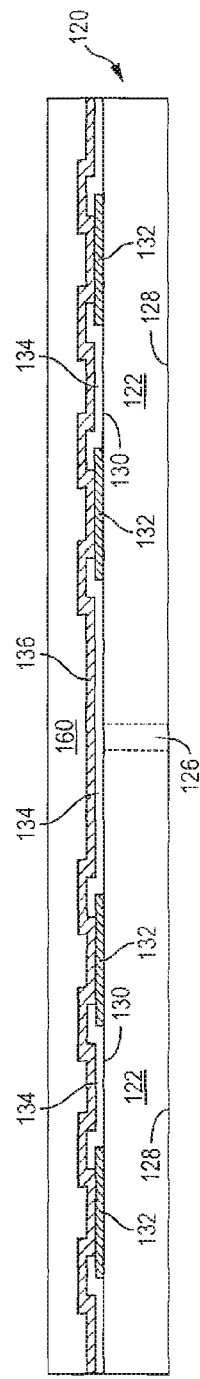

FIGS. 5a-5l illustrate, in relation to FIGS. 1 and 2a-2c, a process of forming a multi-layer conductive pillar having a recess on a semiconductor die. Continuing from FIG. 3d, a patterning or photoresist layer 160 is formed over conductive layer 136 using printing, spin coating, or spray coating, as shown in FIG. 5a. In some embodiments that utilize an insulating layer for patterning, the insulating layer can include one or more layers of SiO2, Si3N4, SiON, Ta2O5, Al2O3, or other material having similar structural properties.

Figure 5B:
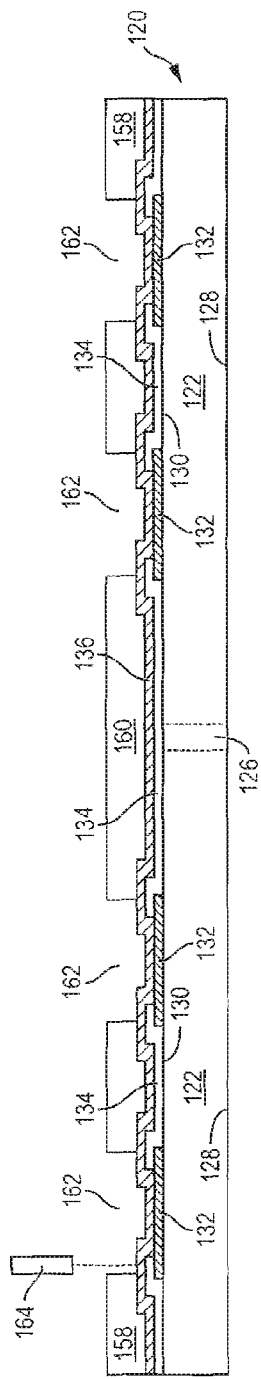
Figure 5C:
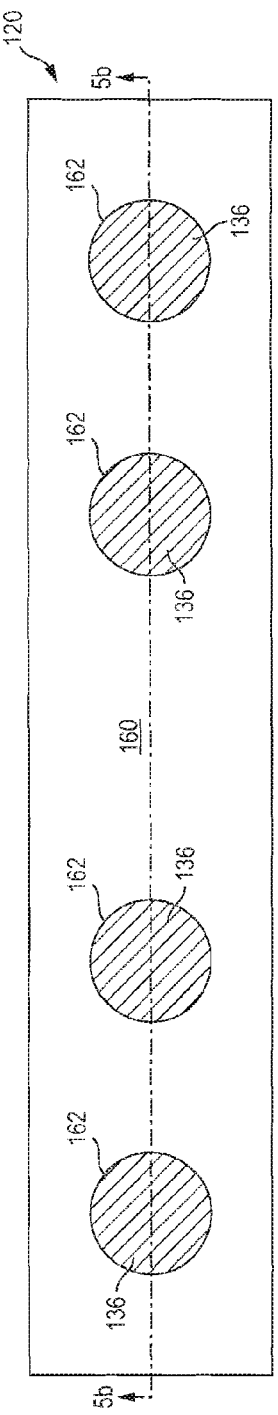

In FIG. 5b, a portion of photoresist layer 160 is removed by an etching process to form openings 162 and expose conductive layer 136 over conductive layer 132. Alternatively, openings 162 are formed by LDA using laser 164 to expose conductive layer 136 over conductive layer 132. FIG. 5c shows a plan view of photoresist layer 160 and openings 162.

In FIG. 5d, an electrically conductive material 166 is deposited within openings 162 over conductive layer 136 using an evaporation, electrolytic plating, electroless plating, or screen printing process. Conductive material 166 can be one or more layers of Al, Cu, Sn, Ni, Au, Ag, or other suitable electrically conductive material. The volume of conductive material 166 deposited into openings 162 is determined by a thickness of photoresist layer 160 and a cross-sectional area or aperture size of openings 162.

In FIG. 5e, a patterning or photoresist layer 168 is formed over photoresist layer 160 and conductive material 166 using printing, spin coating, or spray coating. In some embodiments that utilize an insulating layer for patterning, the insulating layer can include one or more layers of SiO2, Si3N4, SiON, Ta2O5, Al2O3, or other material having similar structural properties.

In FIG. 5f, a portion of photoresist layer 168 is removed by an etching process to form openings 170 and expose conductive material 166. The openings 170 include a plurality of protrusions or projections 174 of photoresist layer 168 extending inward into the opening. Alternatively, openings 170 with protrusions 174 are formed by LDA using laser 164 to expose conductive material 166. The openings 170 have a width less than a width of conductive material 166.

Figure 5G:
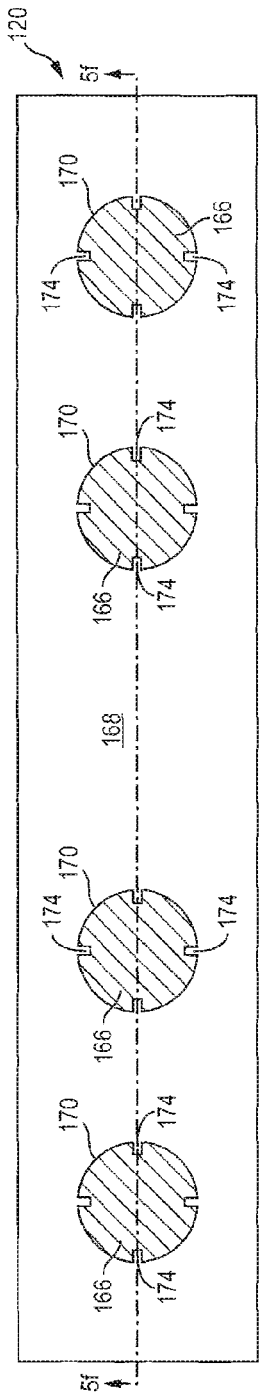

FIG. 5g shows a plan view of photoresist layer 168 and openings 170. In particular, protrusions 174 are formed on four equally spaced locations around openings 170 and extend vertically from conductive material 166 to surface 176.

Figure 5H:
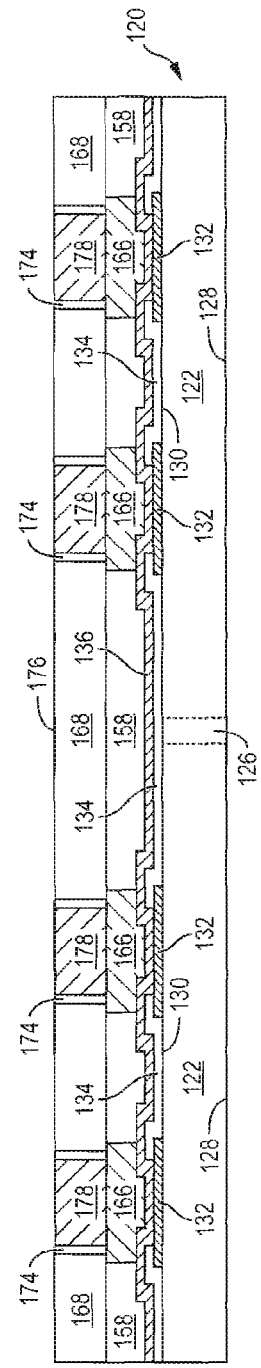

In FIG. 5h, an electrically conductive material 178 is deposited within openings 170 around protrusions 174 and over conductive layer 166 using an evaporation, electrolytic plating, electroless plating, or screen printing process. Conductive material 178 can be one or more layers of Al, Cu, Sn, Ni, Au, Ag, or other suitable electrically conductive material. The volume of conductive material 178 deposited into openings 170 is determined by a thickness of photoresist layer 168 and a cross-sectional area or aperture size of openings 170, taking into account protrusions 174.

Figure 5I:
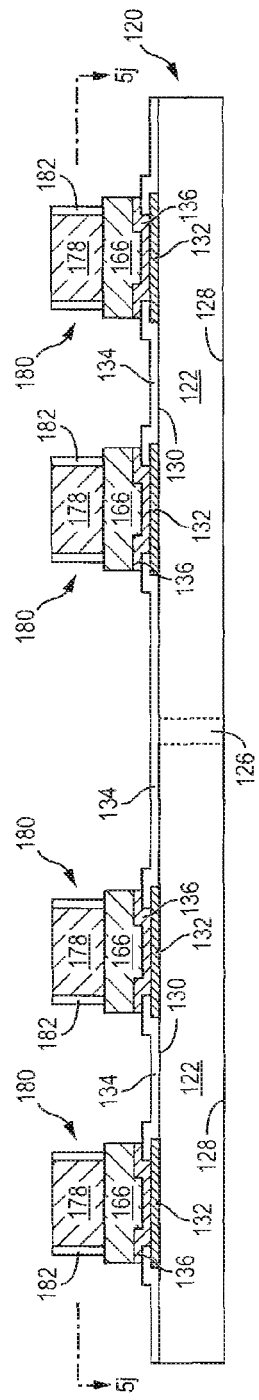
Figure 5J:
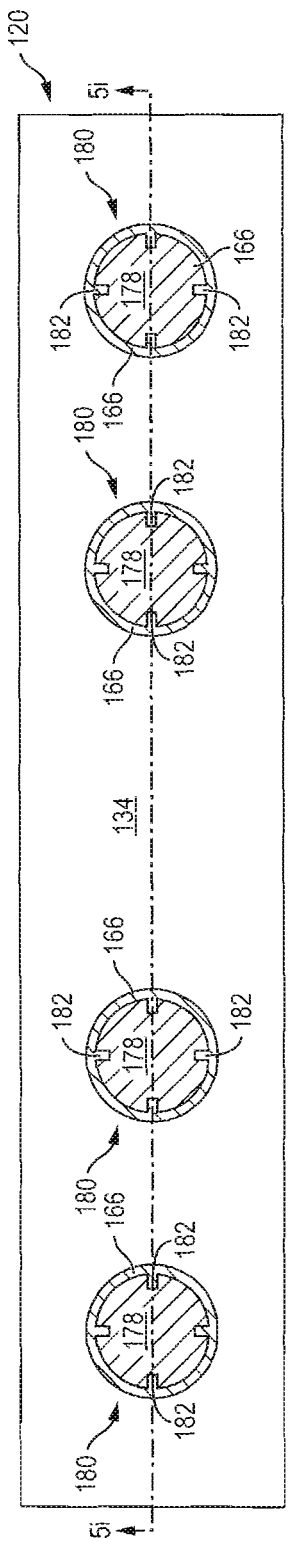
Figure 5K:
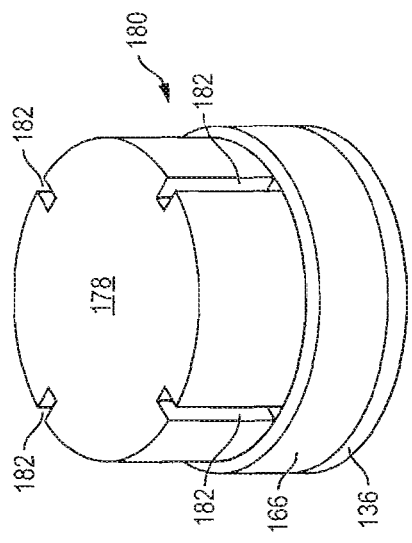

In FIG. 5i, photoresist layers 160 and 168, including protrusions 174, are removed using an etching process and leaving conductive pillars 180 with recesses or notches 182 formed over conductive layer 136. Conductive pillars 180 are multi-layered with conductive material 178 stacked over conductive material 166. In one embodiment, conductive pillars 180 have a generally cylindrical shape with a generally circular cross-section. In another embodiment, conductive pillars 180 have a generally cubic shape with a generally rectangular cross-section. A portion of conductive layer 136 outside a footprint of conductive pillars 180 is also removed by an etching process to expose insulating layer 134. FIG. 5j shows a plan view of conductive pillars 180 with recesses 182 formed over semiconductor die 124, taken along line 5j-5j of FIG. 5i. FIG. 5k shows a prospective view of one conductive pillar 180 with recesses 182. In particular, removing protrusions 174 of photoresist layer 168 from conductive material 178 leaves recesses 182 in conductive pillars 180.

Figure 5L:
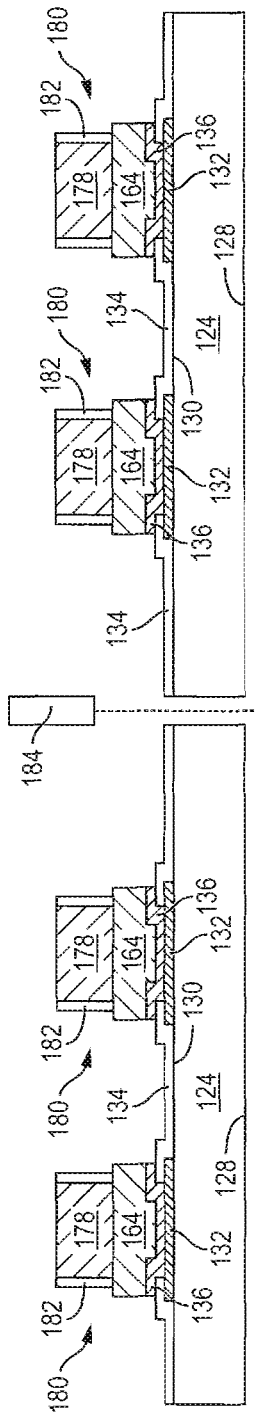

In FIG. 5l, semiconductor wafer 120 is singulated through insulating layer 134 and saw street 126 with saw blade or laser cutting tool 184 into individual semiconductor die 124.

Figure 6A:
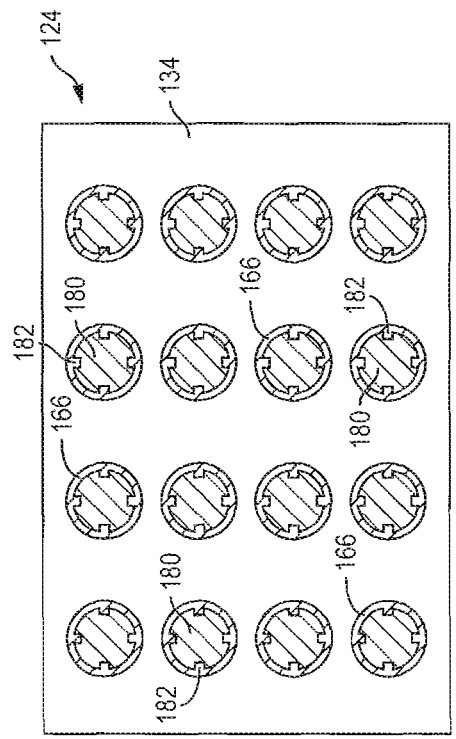
FIGS. 6a-6d illustrate mounting the semiconductor die to the substrate and detecting continuity of the electrical interconnect by presence of bump material in the recess.

FIG. 6a shows a plan view of semiconductor die 124 after singulation. The circuits formed on active surface 130 are electrically connected through conductive layer 132 and conductive layer 136 to multi-layer conductive pillars 180.

Figure 6B:
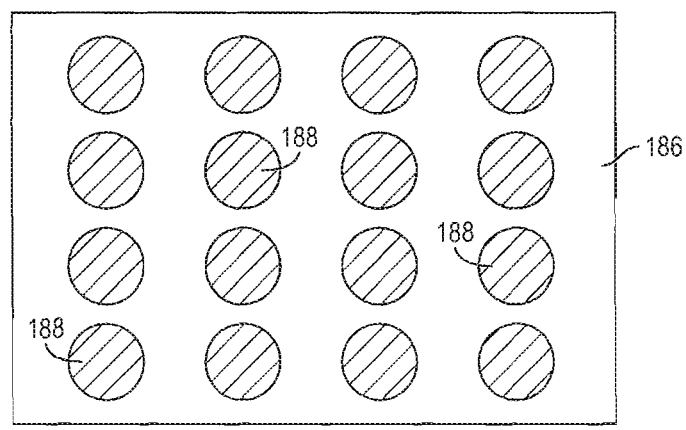

FIG. 6b shows a plan view of substrate or PCB 186 for structural support and electrical interconnect to semiconductor die 124. Conductive layer 188 is formed over a surface or within layers of substrate 186 using evaporation, electrolytic plating, electroless plating, screen printing, or other suitable metal deposition process. Conductive layer 188 includes contact pads and conductive traces for electrical communication, as well as power and ground connections, to semiconductor die 124.

Figure 6C:
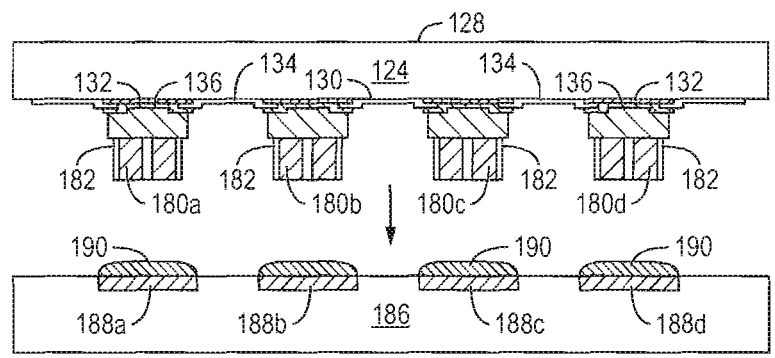

In FIG. 6c, an electrically conductive bump material 190 is deposited over conductive layer 188 using an evaporation, electrolytic plating, electroless plating, ball drop, or screen printing process. Bump material 190 can be Al, Sn, Ni, Au, Ag, Pb, Bi, Cu, solder, and combinations thereof, with an optional flux solution. For example, bump material 190 can be eutectic Sn/Pb, high-lead solder, or lead-free solder. Alternatively, a conductive paste is deposited over conductive layer 188.

Semiconductor die 124 from FIGS. 5a-5l is positioned over substrate 186 using a pick and place operation with active surface 130 oriented toward the substrate and conductive pillars 180a-180d aligned to bump material 190 over conductive layer 188a-188d. Prior to pressing conductive pillars 180 onto conductive layer 188, the temperature of bump material 190 is elevated to melt the bump material.

In the present example, conductive pillars 180a, 180b, and 180d have greater height than conductive pillar 180c due to process variation or warpage. Semiconductor die 124 is pressed toward substrate 186 and conductive pillars 180a, 180b, and 180d make electrical and metallurgical connection to conductive layer 188a, 188b, and 188d, respectively. Due to its lesser height or warpage, conductive pillar 180c fails to make contact with bump material 190 on conductive layer 188c.

Figure 6D:
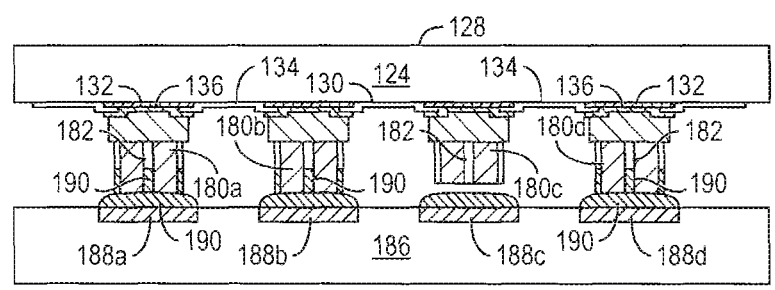

FIG. 6d shows semiconductor die 124 mounted to substrate 186 with conductive pillars 180a, 180b, and 180d electrically and metallurgically connected to conductive layer 188a, 188b, and 188d with bump material 190, respectively. Conductive pillars 180 have recesses 182 extending above the joint between conductive pillar 180 and conductive layer 188 for detecting electrical interconnect continuity by X-ray or visual inspection. Recesses 182 of conductive pillars 180 also provide greater contact surface between the conductive pillar and bump material 190. When conductive pillars 180a, 180b, and 180d of semiconductor die 124 are pressed into bump material 190 over conductive layer 188a, 188b, and 188d of substrate 186, the melted bump material 190 flows into recesses 182 of conductive pillars 180a, 180b, and 180d. Bump material 190 is present and can be detected in recesses 182 of conductive pillars 180a, 180b, and 180d extending above the joint between conductive layer 188a, 188b, and 188d and the corresponding conductive pillars. Due to its lesser height or warpage, conductive pillar 180c fails to make contact with bump material 190 and is not pressed onto conductive layer 188c. The melted bump material 190 does not flow into recess 182 of conductive pillar 180c.

Accordingly, conductive pillars 180 with recesses 182 provide continuity confirmation or inspection and fault detection for electrical interconnects between semiconductor die 124 and substrate 186. Conductive pillars 180a, 180b, and 180d have been pressed into bump material 190 over conductive layer 188a, 188b, and 188d to a sufficient depth that a portion of the melted bump material flows into recesses 182 of conductive pillars 180a, 180b, and 180d. The presence of bump material 190 in recesses 182 indicates electrical continuity and a reliable interconnect union between conductive pillars 180 and conductive layer 188. In the case of conductive pillar 180c, the melted bump material 190 does not flow into recesses 182 of conductive pillar 180c due to failure to make metallurgical connection to conductive layer 188c. The absence of bump material 190 in recesses 182 of conductive pillar 180c indicates no electrical continuity, no interconnect union, or less than reliable interconnect union between conductive pillar 180c and conductive layer 188c. Since recesses 182 extend above the joint between conductive pillar 180 and conductive layer 188, the presence or absence of bump material 190 in recesses 182 can be readily detected or observable by X-ray or visual inspection.

Figure 7A:
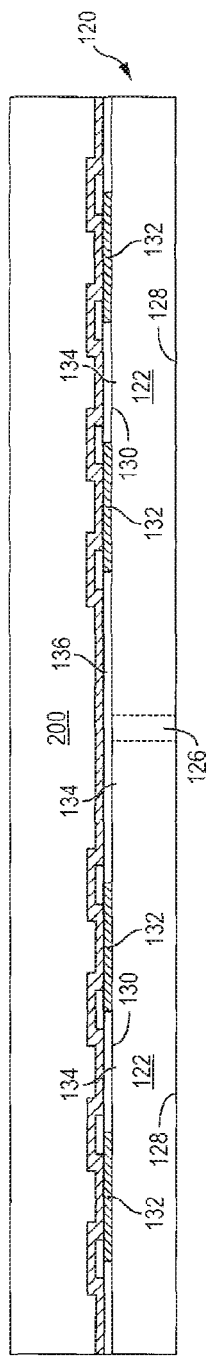
FIGS. 7a-7h illustrate a process of forming a conductive pillar having a protrusion on a semiconductor die.

FIGS. 7a-7h illustrate, in relation to FIGS. 1 and 2a-2c, a process of forming a conductive pillar having a protrusion on a semiconductor die. Continuing from FIG. 3d, a patterning or photoresist layer 200 is formed over conductive layer 136 using printing, spin coating, or spray coating, as shown in FIG. 7a. In some embodiments that utilize an insulating layer for patterning, the insulating layer can include one or more layers of SiO2, Si3N4, SiON, Ta2O5, Al2O3, or other material having similar structural properties.

Figure 7B:
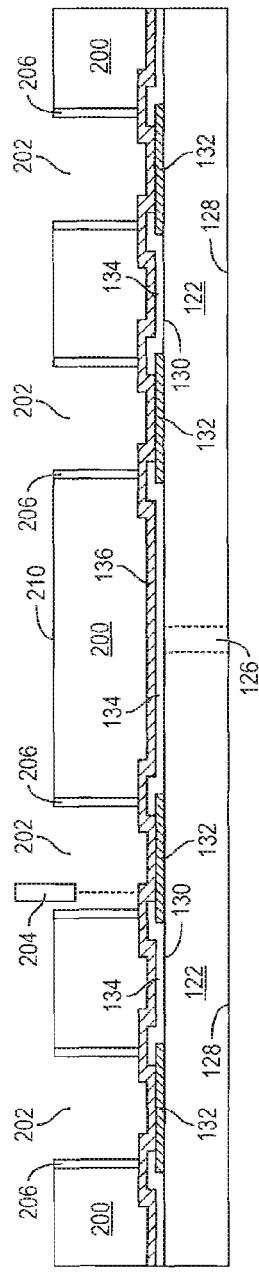
Figure 7C:
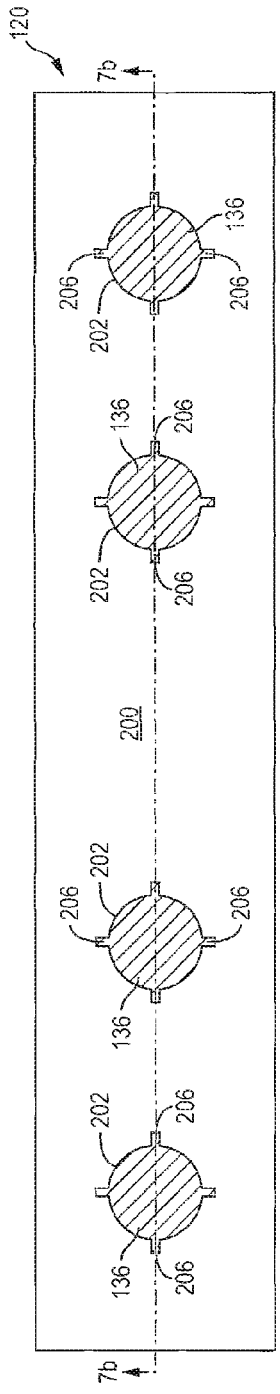

In FIG. 7b, a portion of photoresist layer 200 is removed by an etching process to form openings 202 and expose conductive layer 136 over conductive layer 132. The openings 202 include a plurality of recesses or notches 206 extending outward into photoresist layer 200. Alternatively, openings 202 are formed by LDA using laser 204 to expose conductive layer 136 over conductive layer 132. FIG. 7c shows a plan view of photoresist layer 200 with openings 202 and recesses 206. In particular, recesses 206 are formed on four equally spaced locations around openings 202 and extend vertically from conductive layer 136 to surface 210.

Figure 7D:
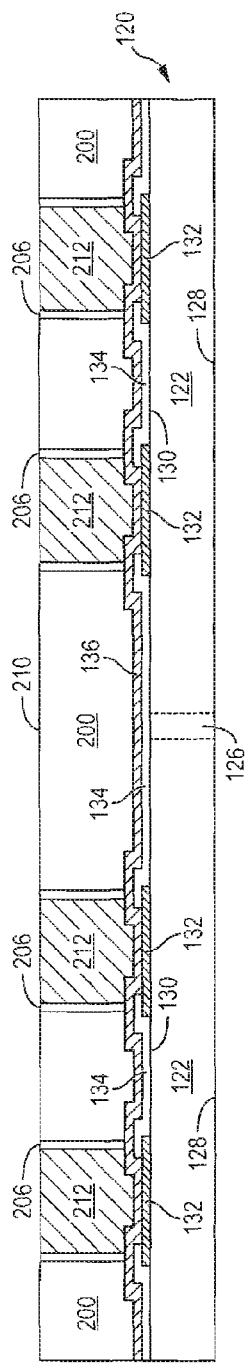

In FIG. 7d, an electrically conductive material 212 is deposited within openings 202 and recesses 206 over conductive layer 136 using an evaporation, electrolytic plating, electroless plating, or screen printing process. Conductive material 212 can be one or more layers of Al, Cu, Sn, Ni, Au, Ag, or other suitable electrically conductive material. The volume of conductive material 212 deposited into openings 202 is determined by a thickness of photoresist layer 200 and a cross-sectional area or aperture size of openings 202, taking into account recesses 206.

Figure 7E:
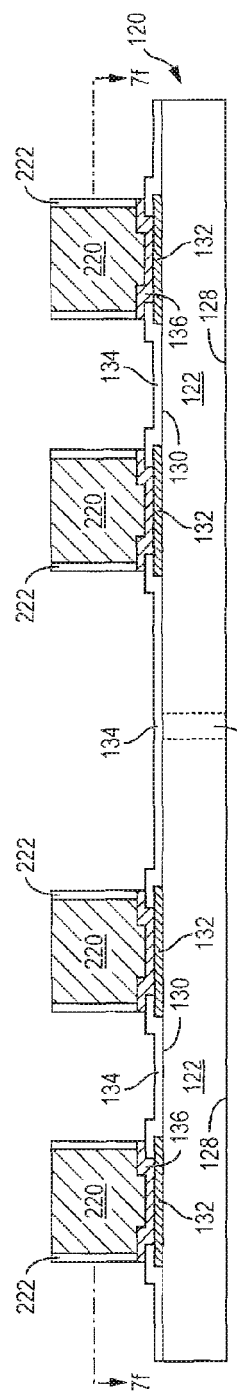
Figure 7F:
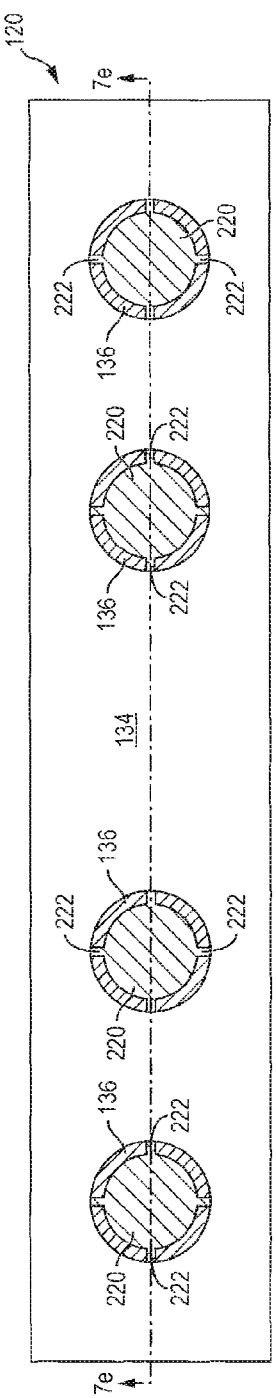
Figure 7G:
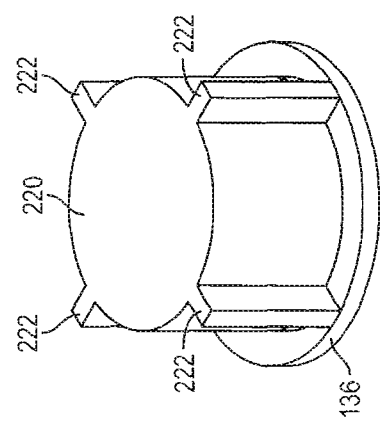

In FIG. 7e, photoresist layer 200 is removed using an etching process and leaving conductive pillars 220 with protrusions 222 formed over conductive layer 136. In one embodiment, conductive pillars 220 have a generally cylindrical shape with a generally circular cross-section. In another embodiment, conductive pillars 220 have a generally cubic shape with a generally rectangular cross-section. A portion of conductive layer 136 outside a footprint of conductive pillars 220 is also removed by an etching process to expose insulating layer 134. FIG. 7f shows a plan view of conductive pillars 220 with protrusions 222 formed over semiconductor die 124, taken along line 7f-7f of FIG. 7e. FIG. 7g shows a prospective view of one conductive pillar 220 with protrusions 222. In particular, protrusions 222 are formed from conductive material 212 in recesses 206.

Figure 7H:
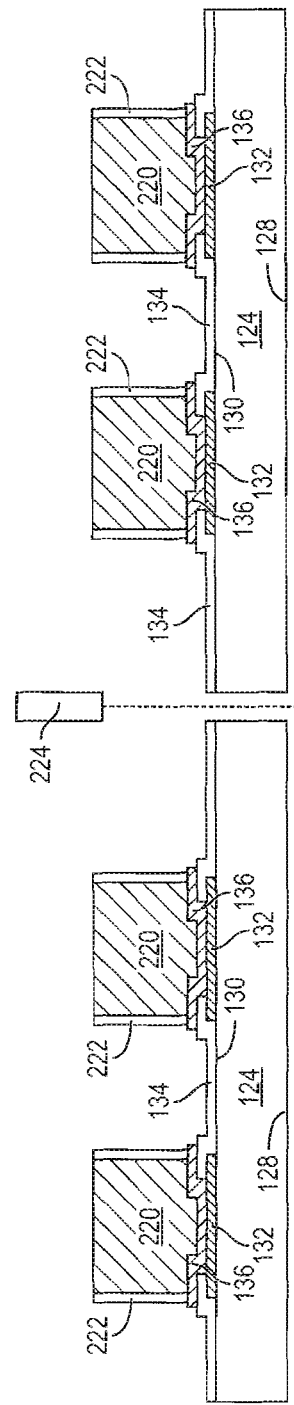

In FIG. 7h, semiconductor wafer 120 is singulated through insulating layer 134 and saw street 126 with saw blade or laser cutting tool 224 into individual semiconductor die 124.

Figure 8A:
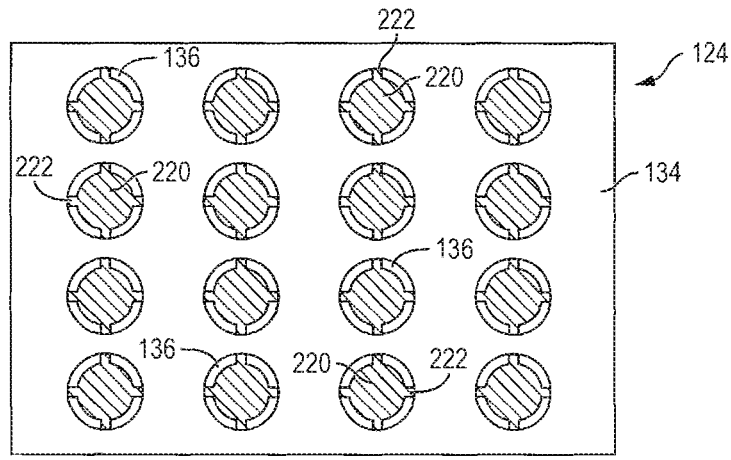
FIGS. 8a-8d illustrate mounting the semiconductor die to the substrate and detecting continuity of the electrical interconnect by presence of bump material on the protrusion.

FIG. 8a shows a plan view of semiconductor die 124 after singulation. The circuits formed on active surface 130 are electrically connected through conductive layer 132 and conductive layer 136 to conductive pillars 220.

Figure 8B:
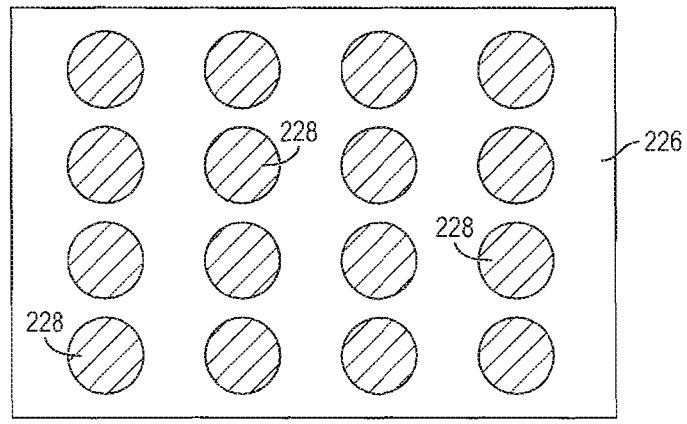

FIG. 8b shows a plan view of substrate or PCB 226 for structural support and electrical interconnect to semiconductor die 124. Conductive layer 228 is formed over a surface or within layers of substrate 226 using evaporation, electrolytic plating, electroless plating, screen printing, or other suitable metal deposition process. Conductive layer 228 includes contact pads and conductive traces for electrical communication, as well as power and ground connections, to semiconductor die 124.

Figure 8C:
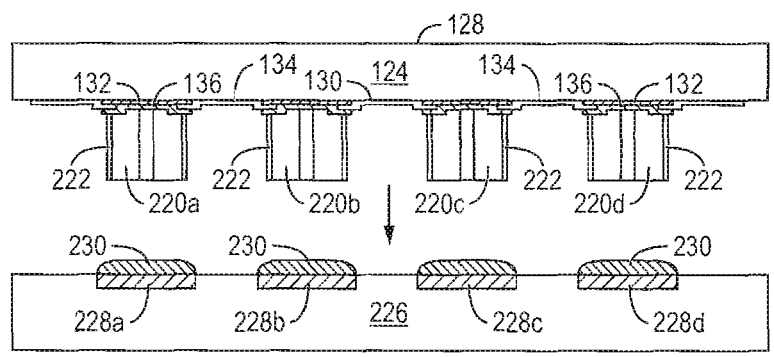

In FIG. 8c, an electrically conductive bump material 230 is deposited over conductive layer 228 using an evaporation, electrolytic plating, electroless plating, ball drop, or screen printing process. Bump material 230 can be Al, Sn, Ni, Au, Ag, Pb, Bi, Cu, solder, and combinations thereof, with an optional flux solution. For example, bump material 230 can be eutectic Sn/Pb, high-lead solder, or lead-free solder. Alternatively, a conductive paste is deposited over conductive layer 228.

Semiconductor die 124 from FIGS. 7a-7h is positioned over substrate 226 using a pick and place operation with active surface 130 oriented toward the substrate and conductive pillars 220a-220d aligned to bump material 230 over conductive layer 228a-228d. Prior to pressing conductive pillars 220 onto conductive layer 228, the temperature of bump material 230 is elevated to melt the bump material.

In the present example, conductive pillars 220a, 220b, and 220d have greater height than conductive pillar 220c due to process variation or warpage. Semiconductor die 124 is pressed toward substrate 226 and conductive pillars 220a, 220b, and 220d make electrical and metallurgical connection to conductive layer 228a, 228b, and 228d, respectively. Due to its lesser height or warpage, conductive pillar 220c fails to make contact with bump material 230 on conductive layer 228c.

Figure 8D:
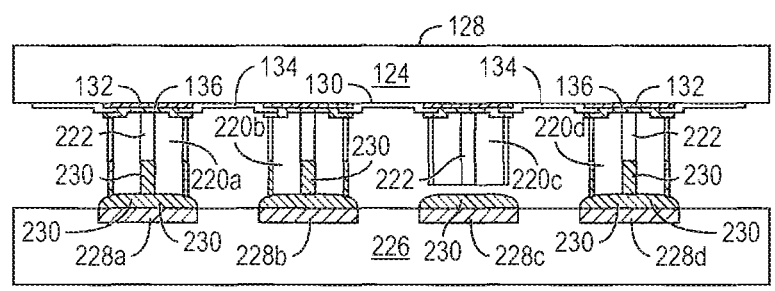

FIG. 8d shows semiconductor die 124 mounted to substrate 226 with conductive pillars 220a, 220b, and 220d electrically and metallurgically connected to conductive layer 228a, 228b, and 228d with bump material 230, respectively. Conductive pillars 220 have protrusions 222 extending above the joint between conductive pillar 220 and conductive layer 228 for detecting electrical interconnect continuity by X-ray or visual inspection. Protrusions 222 of conductive pillars 220 also provide greater contact surface between the conductive pillar and bump material 230. When conductive pillars 220 are pressed into bump material 230 over conductive layer 228, the melted bump material 230 flows into protrusions 222 of conductive pillars 220a, 220b, and 220d. Bump material 230 is present and can be detected on protrusions 222 of conductive pillars 220a, 220b, and 220d extending above the joint between conductive layer 228a, 228b, and 228d and the corresponding conductive pillars. Due to its lesser height or warpage, conductive pillar 220c fails to make contact with bump material 230 and is not pressed onto conductive layer 228c. The melted bump material 230 does not flow onto protrusion 222 of conductive pillar 220c.

Accordingly, conductive pillars 220 with protrusions 222 provide continuity confirmation or inspection and fault detection for electrical interconnects between semiconductor die 124 and substrate 226. Conductive pillars 220a, 220b, and 220d have been pressed into bump material 230 over conductive layer 228a, 228b, and 228d to a sufficient depth that a portion of the melted bump material flows onto protrusions 222 of conductive pillars 220a, 220b, and 220d. The presence of bump material 230 on protrusions 222 indicates electrical continuity and a reliable interconnect union between conductive pillars 220 and conductive layer 228. In the case of conductive pillar 220c, the melted bump material 230 does not flow into protrusions 222 of conductive pillar 220c due to failure to make metallurgical connection to conductive layer 228c. The absence of bump material 230 on protrusions 222 of conductive pillar 220c indicates no electrical continuity, no interconnect union, or less than reliable interconnect union between conductive pillar 220c and conductive layer 228c. Since protrusions extend above the joint between conductive pillar 220 and conductive layer 228, the presence or absence of bump material 230 on protrusions 222 can be readily detected or observable by X-ray or visual inspection.

In summary, semiconductor die 124 has conductive pillar 146 with recess 148 formed over a surface of the semiconductor die. Conductive pillar 146 with recess 148 is made by forming patterning layer 138 over semiconductor die 124, forming opening 140 with protrusion 142 in the patterning layer, depositing conductive material 144 in the opening and over the protrusion, and removing the patterning layer. In another embodiment, conductive pillar 180 with recess 182 is made by forming patterning layer 160 over semiconductor die 124, forming opening 162 in patterning layer 160, depositing conductive material 166 in the opening of the patterning layer, forming patterning layer 168 over patterning layer 160 and conductive material 166, forming opening 170 with protrusion 174 in patterning layer 168, depositing conductive material 178 in the opening and over the protrusion of the patterning layer, and removing patterning layers 160 and 168. In another embodiment, conductive pillar 220 with protrusion 222 is made by forming patterning layer 200 over semiconductor die 124, forming opening 202 with recess 206 in patterning layer 200, depositing conductive material 210 in the opening and recess, and removing patterning layer 200. The opening in the patterning layer can be formed by LDA. Substrate 152 has bump material 158 deposited over conductive layer 154 formed over a surface of the substrate. Bump material 158 is melted. Semiconductor die 124 is pressed toward substrate 152 to enable the melted bump material 158 to flow into recess 148 if conductive pillar 146 makes connection to conductive layer 154. A presence or absence of bump material 158 is detected in recess 148 of conductive pillar 146. A presence or absence of bump material can also be detected over protrusion 222 of conductive pillar 220. The presence or absence of bump material 158 in recess 148 of conductive pillar 146 is detected by X-ray or visual inspection. Recess 148 or protrusion 222 extends beyond a joint between the conductive pillar and conductive layer for ready X-ray or visual inspection.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    forming a plurality of conductive pillars with recesses over a surface of the semiconductor die;
    providing a substrate having a conductive layer formed over a surface of the substrate;
    depositing bump material over the conductive layer;
    melting the bump material over the conductive layer;
    pressing the semiconductor die toward the substrate to enable the melted bump material to flow into the recesses if the conductive pillars make connection to the conductive layer; and
    detecting electrical continuity between the conductive pillars and conductive layer by a presence of the bump material in the recesses by x-ray or visual inspection.

2. The method of claim 1, further including detecting no electrical continuity between the conductive pillars and conductive layer by an absence of the bump material in the recesses.

3. The method of claim 2, further including detecting no electrical continuity between the conductive pillars and conductive layer by X-ray or visual inspection.

4. The method of claim 1, wherein the recesses extend beyond a joint between the conductive pillars and conductive layer.

5. The method of claim 1, wherein forming the conductive pillars with the recesses includes:
    forming a patterning layer over the semiconductor die;
    forming a plurality of openings with protrusions in the patterning layer;
    depositing conductive material in the openings and over the protrusions; and
    removing the patterning layer.

6. The method of claim 1, wherein forming the conductive pillars with the recesses includes:
    forming a first patterning layer over the semiconductor die;
    forming a plurality of openings in the first patterning layer;
    depositing a first conductive material in the openings of the first patterning layer;
    forming a second patterning layer over the first patterning layer and first conductive material;
    forming a plurality of openings with protrusions in the second patterning layer;
    depositing a second conductive material in the openings and over the protrusions of the second patterning layer; and
    removing the first and second patterning layers.

7. A method of making a semiconductor device, comprising:
    providing a semiconductor die;
    forming a conductive pillar including a recess or protrusion over a surface of the semiconductor die;
    providing a substrate having bump material deposited over a conductive layer formed over a surface of the substrate;
    melting the bump material;
    pressing the semiconductor die toward the substrate to enable the melted bump material to flow into the recess or over the protrusion if the conductive pillar makes connection to the conductive layer; and
    detecting a presence or absence of the bump material in the recess or protrusion of the conductive pillar.

8. The method of claim 7, further including detecting the presence or absence of the bump material in the recess or protrusion of the conductive pillar by X-ray or visual inspection.

9. The method of claim 7, wherein the recess or protrusion extends beyond a joint between the conductive pillar and conductive layer.

10. The method of claim 7, wherein forming the conductive pillar with the recess includes:
    forming a patterning layer over the semiconductor die;
    forming an opening including a protrusion in the patterning layer;
    depositing conductive material in the opening and over the protrusion in the patterning layer; and
    removing the patterning layer.

11. The method of claim 10, further including forming the opening with the protrusion in the patterning layer by laser direct ablation.

12. The method of claim 7, wherein forming the conductive pillar with the recess includes:
  forming a first patterning layer over the semiconductor die;
  forming an opening in the first patterning layer;
  depositing a first conductive material in the opening of the first patterning layer;
  forming a second patterning layer over the first patterning layer and first conductive material;
  forming an opening including a protrusion in the second patterning layer;
  depositing a second conductive material in the opening and over the protrusion of the second patterning layer; and
  removing the first and second patterning layers.

13. The method of claim 7, wherein forming the conductive pillar with the protrusion includes:
  forming a patterning layer over the semiconductor die;
  forming an opening with a recess in the patterning layer;
  depositing conductive material in the opening and recess; and
  removing the patterning layer.

14. A method of making a semiconductor device, comprising:
  providing a semiconductor die; and
  forming a conductive pillar including a recess or protrusion over a surface of the semiconductor die for detecting electrical connection.

15. The method of claim 14, further including:
  providing a substrate;
  mounting the semiconductor die to the substrate with bump material;
  detecting electrical connection by a presence of the bump material in the recess or protrusion of the conductive pillar; and
  detecting no electrical connection by an absence of the bump material in the recess or protrusion of the conductive pillar.

16. The method of claim 15, further including:
  forming a conductive layer over the substrate;
  melting the bump material; and
  pressing the semiconductor die toward the substrate to enable the melted bump material to flow into the recess or over the protrusion if the conductive pillar makes connection to the conductive layer.

17. The method of claim 15, further including detecting the presence or absence of the bump material in the recess or protrusion of the conductive pillar by X-ray or visual inspection.

18. The method of claim 15, wherein forming the conductive pillar with the recess includes:
  forming a patterning layer over the semiconductor die;
  forming an opening including a protrusion in the patterning layer;
  depositing conductive material in the opening and over the protrusion of the patterning layer; and
  removing the patterning layer.

19. The method of claim 18, further including forming the opening with the protrusion in the patterning layer by laser direct ablation.

20. The method of claim 15, wherein forming the conductive pillar with the recess includes:
  forming a first patterning layer over the semiconductor die;
  forming an opening in the first patterning layer;
  depositing a first conductive material in the opening of the first patterning layer;
  forming a second patterning layer over the first patterning layer and first conductive material;
  forming an opening including a protrusion in the second patterning layer;
  depositing a second conductive material in the opening and over the protrusion of the second patterning layer; and
  removing the first and second patterning layers.

21. A method of making a semiconductor device, comprising:
  providing a semiconductor die; and
  forming a conductive pillar including a recess or protrusion over a surface of the semiconductor die; and
  detecting a presence or absence of a bump material in the recess or protrusion of the conductive pillar.

22. The method of claim 21, further including:
  providing a substrate;
  mounting the semiconductor die to the substrate with the bump material;
  detecting electrical connection by the presence of the bump material in the recess or protrusion of the conductive pillar; and
  detecting no electrical connection by the absence of the bump material in the recess or protrusion of the conductive pillar.

23. The method of claim 22, further including:
  forming a conductive layer over the substrate;
  melting the bump material; and
  pressing the semiconductor die toward the substrate to enable the melted bump material to flow into the recess or over the protrusion if the conductive pillar makes connection to the conductive layer.

24. The method of claim 22, wherein forming the conductive pillar including the recess or protrusion further comprises:
  forming a patterning layer over the semiconductor die;
  forming an opening including a protrusion in the patterning layer;
  depositing conductive material in the opening and over the protrusion of the patterning layer; and
  removing the patterning layer.

25. The method of claim 21, further including detecting the presence or absence of the bump material in the recess or protrusion of the conductive pillar by X-ray or visual inspection.

* * * * *